United States Patent
Keränen et al.

(10) Patent No.: US 10,670,800 B2
(45) Date of Patent: Jun. 2, 2020

(54) ILLUMINATED MULTILAYER STRUCTURE WITH EMBEDDED LIGHT SOURCES

(71) Applicant: TACTOTEK OY, Oulunsalo (FI)

(72) Inventors: Antti Keränen, Oulunsalo (FI); Mikko Heikkinen, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 0 days.

(21) Appl. No.: 16/155,956

(22) Filed: Oct. 10, 2018

(65) Prior Publication Data
US 2019/0064431 A1    Feb. 28, 2019

Related U.S. Application Data

(63) Continuation of application No. PCT/FI2017/050259, filed on Apr. 11, 2017.
(Continued)

(51) Int. Cl.
*F21S 10/00*    (2006.01)
*F21V 8/00*    (2006.01)
(Continued)

(52) U.S. Cl.
CPC ......... *G02B 6/0091* (2013.01); *G02B 6/0021* (2013.01); *G02B 6/0031* (2013.01); *G02B 6/0051* (2013.01); *G02B 6/0065* (2013.01); *G02B 6/0093* (2013.01); *H05K 1/028* (2013.01); *H05K 1/0274* (2013.01); *H05K 1/181* (2013.01); *H05K 3/12* (2013.01); *H05K 3/284* (2013.01);
(Continued)

(58) Field of Classification Search
CPC .. G02B 6/0091; G02B 6/0065; G02B 6/0093; G02B 6/0051; G02B 6/0055; H05K 1/181; H05K 1/0274; H05K 3/284; H05K 1/028; H05K 3/12; H05K 2203/1316; H05K 2203/1327; H05K 2201/0129; H05K 2201/10121; H05K 2201/10106
See application file for complete search history.

(56) References Cited

U.S. PATENT DOCUMENTS 6,416,196 B1 * 7/2002 Lemarchand ........ H01H 13/023
                                                           362/23.03
2004/0223328 A1 * 11/2004 Lee ..................... B60Q 1/2607
                                                            362/249.01
(Continued)

OTHER PUBLICATIONS

International Search Report issued by the Finnish Patent and Registration Office acting as the International Searching Authority in relation to International Application No. PCT/FI2017/050259 dated Sep. 29, 2017 (8 pages).
(Continued)

*Primary Examiner* — Y M. Quach Lee
(74) *Attorney, Agent, or Firm* — Robert P. Michal, Esq.; Carter, DeLuca & Farrell LLP (57) ABSTRACT

An electronic device includes a substrate film having a first side and a second side, and a number of light sources configured to emit light. A plastic lightguide layer is molded onto the first side of the substrate film. The plastic lightguide layer being of optically at least translucent material to transmit light. The device also includes a masking layer provided on the outer surface of the plastic lightguide layer. The masking layer defines a window for letting the light emitted by the embedded light sources to pass through the masking layer towards the environment.

18 Claims, 3 Drawing Sheets

Related U.S. Application Data (60) Provisional application No. 62/321,768, filed on Apr. 13, 2016.

(51) Int. Cl.
| | |
|---|---|
| *H05K 1/02* | (2006.01) |
| *H05K 1/18* | (2006.01) |
| *H05K 3/12* | (2006.01) |
| *H05K 3/28* | (2006.01) |

(52) U.S. Cl.
CPC .... *G02B 6/0055* (2013.01); *H05K 2201/0129* (2013.01); *H05K 2201/10106* (2013.01); *H05K 2201/10121* (2013.01); *H05K 2203/1316* (2013.01); *H05K 2203/1327* (2013.01)

(56) References Cited

U.S. PATENT DOCUMENTS

| | | |
|---|---|---|
| 2005/0265029 A1 | 12/2005 | Epstein et al. |
| 2007/0171649 A1* | 7/2007 | Rains, Jr. ................ F21S 2/00 362/303 |
| 2008/0253140 A1 | 10/2008 | Fleischmann et al. |
| 2010/0089731 A1 | 4/2010 | Chiang et al. |
| 2010/0232171 A1 | 9/2010 | Cannon et al. |
| 2011/0051412 A1 | 3/2011 | Jeong et al. |
| 2011/0228193 A1 | 9/2011 | Shin et al. |
| 2016/0007475 A1* | 1/2016 | Zanesi ................ H05K 1/038 361/760 |
| 2017/0094796 A1* | 3/2017 | Lor ........................ H05K 3/284 |

OTHER PUBLICATIONS

Written Opinion of the International Searching Authority issued by the Finnish Patent and Registration Office acting as the International Searching Authority in relation to International Application No. PCT/FI2017/050259 dated Sep. 29, 2017 (10 pages).

Written Opinion of the International Searching Authority issued by the Finnish Patent and Registration Office acting as the International Searching Authority in relation to International Application No. PCT/FI2017/050259 dated Jul. 5, 2018 (8 pages).

International Preliminary Report on Patentability issued by the Finnish Patent and Registration Office acting as the International Preliminary Examination Authority in relation to International Application No. PCT/FI2017/050259 dated Aug. 9, 2018 (9 pages).

Extended European Search Report issued by the European Patent Office in relation to European Application No. 17781988.5 dated Nov. 28, 2019 (7 pages).

* cited by examiner

ILLUMINATED MULTILAYER STRUCTURE WITH EMBEDDED LIGHT SOURCES

CROSS-REFERENCE TO RELATED APPLICATIONS

This application is a continuation of PCT International Application No. PCT/FI2017/050259 filed Apr. 11, 2017, which claims priority to U.S. Provisional Patent Application No. 62/321,769, filed Apr. 13, 2016, the disclosure of each of these applications is expressly incorporated herein by reference in their entirety.

FIELD OF THE INVENTION

Generally the present invention relates to multilayer structures in connection with electronics, associated devices, and methods of manufacture. In particular, however not exclusively, the present invention concerns provision of integral illumination solution within a multilayer structure.

BACKGROUND

Generally there exists a variety of different stacked assemblies and structures in the context of e.g. electronics and electronic products such as various electronic devices.

The motivation behind stacking electronics and other elements in a common structure may be as diverse as the related use contexts. Relatively often size savings, weight savings, cost savings, usability benefits, or just efficient integration of components in terms of e.g. the manufacturing process or logistics is sought for when the resulting optimized solution ultimately exhibits a multilayer nature. In turn, the associated use scenarios may relate to product packages or food casings, visual design of device housings, wearable electronics, personal electronic devices, displays, detectors or sensors, vehicle interiors, antennae, labels, vehicle and particularly automotive electronics, etc.

Electronics such as electronic components, ICs (integrated circuit) and conductors may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not necessarily always the case.

A substrate such as a plastic substrate film, may be subjected to processing, e.g. (thermo)forming or molding. Indeed, using e.g. injection molding a plastic layer may be provided on the film, potentially then embedding a number of elements such as electronic components present on the film. The plastic layer may have different mechanical, optical, electrical, etc. properties. The obtained multilayer, or stacked, structure may be configured for a variety of purposes depending on the included features, such as electronics, and the intended use scenario and related use environment. It may, for instance, comprise connecting features such as fluke type protrusions for coupling with compatible recesses of a host element or vice versa.

Occasionally different elements, surfaces or devices should be provided with illumination capability that may bear e.g. decorative/aesthetic or functional, such as guiding or indicative, motive. For example, the environment of the element or device should be floodlit for increasing visibility in the gloom or dark during night-time, which may, in turn, enable trouble-free performing of various human activities typically requiring relatively high lighting comfort, such as walking or reading, to take place. Alternatively, the illumination could be applied to warn or inform different parties regarding e.g. the status of the host element or connected remote device via different warning or indicator lights. Yet, the illumination might yield the host element a desired appearance and visually emphasize its certain features by providing e.g. brighter areas thereon with desired color. Accordingly, the illumination could also be applied to instruct a user of the device about e.g. the location of different functional features such as keys, switches, touch-sensitive areas, etc. on the device surface, or about the actual function underlying the illuminated feature.

Thus, there are a great number of use cases for illumination in conjunction with different structures and devices. As the illumination may not, however, always be a critical or sole feature of highest priority or of most importance in the associated product, and it may actually be considered a supplementary, optional feature only, the design and implementation of lighting features providing the desired illumination effect shall be duly executed. Weight and size requirements, elevated power consumption, additional design considerations, new process steps, and generally increased overall complexity of the manufacturing phase and the resulting product are all examples of numerous drawbacks easily becoming materialized as a side effect of adopting lighting features in the target solution. Yet, the appearance of the lighting effect and e.g. perceivability of lighting elements is one other issue. In some applications, the light sources should remain hidden or weakly exposed, or the lighting effect should be rather delicate without hotspots.

SUMMARY

An objective of the present invention is to at least alleviate one or more of the above drawbacks associated with the existing solutions in the context of various electronic devices or other host elements that are to be provided with lighting features.

An objective is achieved with the embodiments of a multilayer assembly and a related method of manufacture in accordance with the present invention.

According to one embodiment of the present invention, a multilayer assembly for an electronic device comprises a preferably flexible substrate film configured to accommodate electronics, such as conductive traces and electronic components, e.g. SMDs (surface-mount device), on at least first side thereof, said film having the first side and a second side, a number of light sources, preferably LEDs, provided on the first side of the substrate film and configured to emit light of predetermined frequency or frequency band, preferably including or substantially limiting to visible light, a molded plastic lightguide layer provided onto the first side of the substrate film and at least partially embedding the light sources, the plastic lightguide layer being of optically at least translucent, optionally transparent, material having regard to the predetermined frequency or band, wherein the plastic lightguide layer is configured to transmit light emitted by the embedded light sources so that the transmitted light propagates within the lightguide layer and is outcoupled from the plastic lightguide layer via an outer surface thereof substantially opposite to the embedded light sources, and a masking layer provided on the outer surface of the plastic lightguide layer, containing substantially opaque material to block external view of at least some internals of the multilayer structure including the light sources, wherein the masking layer defines a window for letting the light emitted by the embedded light sources and propagated within the plastic lightguide layer to pass through the masking layer towards the environment, the light sources, masking layer and related window being mutually configured such that there is no direct line-of-sight (LOS) path at least within a selected viewing angle from outside the assembly, preferably including zero angle from the surface normal of the masking layer, to the light sources and optionally farther electronics through the window.

According to one other embodiment, a method of establishing a multilayer assembly for an electronic device comprises obtaining a preferably flexible substrate film configured to accommodate electronics on at least first side thereof, said film having the first side and a second side, providing a number of light sources on the first side of the substrate film, said light sources being configured to emit light of predetermined frequency or frequency band, molding a plastic lightguide layer onto the first side of the substrate and thereby at least partially embedding the light sources, the plastic lightguide layer being of optically at least translucent, optionally transparent, material having regard to the predetermined frequency or band of light, wherein the plastic lightguide layer is configured to transmit light emitted by the embedded light sources so that the transmitted light propagates within the lightguide layer and is outcoupled from the lightguide layer via an outer surface thereof substantially opposite to the embedded light sources, and providing a masking layer on the outer surface of the lightguide layer containing substantially opaque material to block external view of at least some internals of the multilayer structure including the light sources, wherein the masking layer defines a window for letting the light emitted by the embedded light sources and propagated within the lightguide layer to pass through the masking layer towards the environment, the light sources, masking layer and related window being mutually configured such that there is no direct line-of-sight path at least within a selected viewing angle from outside the assembly to the light sources and optionally further electronics through the window.

A device such as an electronic device comprising an embodiment of the assembly may be provided. The device may be a portable, hand-held, wearable, desktop or other type of a device. It may be of stand-alone type or the device may constitute a part of a larger ensemble with reference to a dashboard of a vehicle, for example.

Different considerations presented herein concerning the embodiments of the assembly may be flexibly applied to the embodiments of the method mutatis mutandis, and vice versa, as being appreciated by a skilled person.

The utility of the present invention arises from a plurality of issues depending on the embodiment.

Lighting features such as light sources and associated optics, guiding layers, lenses, diffusers, collimators, prisms, diffracting elements, reflectors, opaque/masking elements, etc. may be cleverly integrated into a common assembly, which may in turn establish at least part of a host device or host element. The applicable light sources include different printed light sources such as OLEDs and more traditional mountable components such as LEDs, both alike. The illumination effect thus created may bear aesthetic/decorative, indicative, instructive and/or warning functions, for example. By the proper configuration of the light sources, intermediate elements and the window, including e.g. the positioning of the masking layer in relation to the embedded light sources and lightguide layer, the outcoupled light may appear very uniform while the masking layer conceals the hideous electronics such as the light sources from the external viewer.

Yet, the assembly may exhibit a selected appearance or e.g. tactile feel to the viewer such as operator by the configuration of surface graphics, embedded graphics (may still be visible e.g. through the window), surface materials with different surface profiles, general shape, etc.

The obtained structure may be generally kept relatively light, thin and energy efficient. The optical coupling between the embedded optoelectronics such as light sources or sensors and the lightguide may be strong with low loss and without substantial artifacts. Yet, the assembly may be somewhat simple and compact by construction, which usually converts into durability and other assets a well. Relative simplicity of the associated manufacturing process yields benefits own its own with reference to e.g. the related rather tolerable device and material costs, space, process time, logistic and storage requirements.

The used thermoplastic material may be optimized for various purposes including securing electronics in view of the molding process. Yet, the molded material optionally together with other used materials may be configured to protect the embedded elements such as electronics from e.g. environmental conditions such as moisture, heat, cold, dirt, shocks, etc.

The expression "a number of" may herein refer to any positive integer starting from one (1).

The expression "a plurality of" may refer to any positive integer starting from two (2), respectively.

The ordinal numbers such as "first" and "second" are herein used to distinguish one element from other element, and not to specially prioritize or order them, if not otherwise explicitly stated.

The terms "film" and "foil" are herein used generally interchangeably, unless otherwise explicitly indicated.

Different embodiments of the present invention are disclosed in the attached dependent claims.

BRIEF DESCRIPTION OF THE DRAWINGS

Next the present invention will be described in greater detail with reference to the accompanying drawings, in which.

DETAILED DESCRIPTION

In various embodiments, the masking layer may incorporate a coating, such as a film, on the molded plastic lightguide layer. The masking layer may itself be produced on a carrier such as the plastic lightguide layer using a suitable deposition or other method, for instance, or some other carrier, e.g. a cover layer, to be then provided upon the lightguide layer and preferably secured thereto using e.g. suitable lamination method. Alternatively, the masking layer defined by a film, plate/board and/or other element(s) may be formed separately beforehand using e.g. extrusion or molding and then provided for installation at the assembly.

In various embodiments, the assembly may indeed contain at least one further cover, or 'top', layer upon and typically in contact with the masking layer. The cover layer may host or otherwise connect to the masking layer, protect the underlying structures and/or exhibit a desired appearance such as color scheme, graphics, etc.

The cover layer may be provided by at least one cover element such as a film, plate/board or other coating/cover element on the masking layer. The cover layer may also contain a window for enabling the light emitted by the light sources to pass through to the environment. The window may be aligned and at least partially overlapping with the window of the underlying masking layer. It may be of same or different size.

The material(s) of the cover may include plastic, glass, leather, textile, organic or generally fibrous material, for example. Similar considerations apply to the masking layer. The material(s) of the optional cover layer(s) may differ from the material of the masking layer. In some embodiments, the material may be substantially translucent or transparent having regard e.g. to the wavelengths emitted by the light sources of the assembly. In some other embodiments, it may be substantially opaque. The cover and/or masking layer may have e.g. rubber or rubberous surface. The surface material and topology (surface forms) may be optimized to provide desired feel and/or aesthetic properties in addition to or instead of e.g. insulation (e.g. moisture and/or thermal) or dampening property. The cover and/or masking layer may be flexible, elastic or stiff/rigid.

In various embodiments, the masking layer and/or other layer/element between the masking layer and the lightguide layer may be at least locally reflective having regard to the light emitted by the light sources to enhance e.g. light propagation within the lightguide instead of leaks due to absorption or transmission. It may contain reflective material, optionally enabling e.g. specular or diffuse reflection therefrom.

In addition to or instead of at least one cover layer, at least one bottom layer defined e.g. by a film or board/plate may be provided on the second, or 'bottom', side of the substrate film using a selected lamination or deposition technique, for example.

A bottom layer may protect the assembly and/or facilitate its attachment to a host device, for instance, if the assembly is not secured to the host via the substrate. The bottom layer or in some scenarios, directly the substrate, may thus contain attaching features such as adhesive material and/or mechanical fixing structure(s) e.g. in the form of boss/base, clip, hook, recess, etc. for the purpose.

With reference to the paragraphs above, the bottom layer may be configured to at least locally reflect light or otherwise control light propagation that is preferably at least mainly occurring within the lightguide layer and possibly the substrate film. For the purpose, it may contain reflective, optionally diffusively or specularly reflective, (surface) material, for example. The bottom layer may be flexible or rigid/stiff.

Thus, depending on the used layer materials, their thicknesses, and e.g. embedded elements, the overall assembly may be generally flexible or rigid/stiff. In some embodiments, its bottom may at least be flexible thus better conforming to the surface forms of a potential host device or support. Alternatively or additionally, the top may be flexible enabling shaping it e.g. dynamically.

In various embodiments, the substrate film may contain plastic, metal, glass, leather, textile, organic and/or fibrous material (e.g. paper or cardboard). The substrate film may be optically translucent or transparent having regard to selected wavelength(s). Preferably, the substrate film is or at least contains electrically insulating (dielectric) material. The light emitted by the light sources and later incident on the substrate may be capable of being at least partially absorbed by or penetrating (transmitting) through the substrate film depending on the used materials, respective refractive indices and general configuration, e.g. geometry and surface topology, of the arrangement and elements thereof. However, the substrate film may be at least locally reflective and contain reflective (surface) material e.g. in the form of coating or more thoroughly.

In various embodiments, the substrate has been formed, preferably through thermoforming such as pressure forming, vacuum forming or hydroforming, to a desired substantially three-dimensional (non-planar), e.g. curved, angular or undulating, shape relative to its own thickness prior to or upon the provision of e.g. plastic lightguide layer thereon. The resulting 3d-shape could be several times thicker than the initial film. Electronics such as printed electronics and/or mounted components may have been already provided on the substrate prior to forming. Additionally or alternatively, the electronics may have been provided to the substrate subsequent to forming.

In various embodiments, the window may be defined by an opening, such as a through-hole, flap or cut, in the masking layer and optional further layers thereon. In some embodiments, the masking layer and optionally further layers thereon could include multiple, spatially discrete windows each letting the light of desired wavelength(s), such as the wavelengths of the embedded lights sources, to pass through.

The window(s) in the masking layer and/or other layer(s) establishing part of the concerned light path may optionally contain translucent, optionally transparent, material having regard to the aforesaid wavelength or band, optionally glass or plastic, such as glazing. It may define optically functional element such as a lens, prism or other refractive element, and/or a diffractive element, for example.

In some embodiments, the window material may establish a substantially planar piece. The related surfaces may be flat as well.

In some embodiments, however, the top surface (towards the environment, away from the lightguide layer) and/or the opposite bottom surface facing towards the lightguide may bear a substantially three-dimensional shape, e.g. non-planar shape. It may define dome, recess and/or protrusion shape(s), for example.

The micro-level surface of the window fill may be generally smooth or rough.

A piece of material filling the window opening may also extend at least partially through upper layer(s) towards the environment.

The window may exhibit a desired indicative and/or decorative shape, such as at least partial shape of a text, number, symbol, graphical pattern, and/or figure. Yet, the window material, when applicable, may be of selected color. In some embodiments, the window may contain multiple different overlapping (in the direction of the surface normal of the multilayer structure, i.e. thickness direction) and/or adjacent materials with different properties, e.g. color, transmittance and/or refractive index.

In various embodiments, the material of the lightguide layer may establish at least part of the window filling. The material may define e.g. a protrusion from the lightguide layer that is accommodated in the window defined by the masking layer and optionally potential further layers. The lightguide material may in some embodiments also establish at least a part of the exterior (top) surface of the assembly.

The multilayer assembly may be generally substantially planar or flat. The order of magnitude of the width and length of the assembly may thus be different from the height (the direction in which the layers are stacked), i.e. 'thickness', which may be considerably smaller. For example, the thickness may be only a few millimeters or less whereas the width and length may be several centimeters or more, even considerably more depending on the embodiment. The thickness may be constant or it may vary considering e.g. the general shape of a discus that the shape of the assembly may in some embodiments generally conform to.

In various embodiments, the assembly may be adapted to produce, by the configuration of the associated elements, such as light sources, material layers and optional further optically functional elements, uniform lighting via the window from the standpoint of an external viewer.

As hinted hereinbefore, in various embodiments, the assembly or at least element thereof may be configured to diffuse light emitted by the light sources. Diffusion may soften the light and reduce the contrast between bright and dark areas. It may help in obtaining more uniform lighting effect via the window. For the purpose, the assembly may contain specific diffusers such as diffusive reflector and/or translucent diffuser, optionally in the form of e.g. plastic film. The diffuser(s) may be dedicated ones or integral with any aforesaid layer. Also the aforementioned non-LOS positioning of light sources relative to the masking layer and window(s) thereof may add to the uniform lighting so that no light rays may pass the window(s) directly from the light sources without preceding interactions such as reflections within the assembly. Direct light paths easily cause hotspots visible to the environment.

In some embodiments, the assembly or at least element thereof may be configured to collimate light and thus include a collimator. For example, the element(s) defining the window (fill) material(s) or some other element located functionally prior to the window structure, e.g. a reflector, may be arranged to collimate incident light originally emitted by the light sources and to be outcoupled via the window.

In some embodiments, instead of or in addition to light sources, a number of light receivers or detectors, such as photodiodes, phototransistors, other suitable photoelectric elements, or e.g. photovoltaic elements (e.g. solar cell) provided on the substrate film are at least partially embedded through molding inside the established plastic layer. These elements are configured to capture or generally sense the light received through the window and/or emitted by the light sources and propagated within the plastic lightguide layer. Sensing data may be utilized in adjusting the light sources, for example.

In various embodiments, the light sources or other electronics may have been embedded in the material of the plastic lightguide layer right through molding the lightguide material thereon. In some other embodiments, the readymade lightguide layer, or at least the concerned portion thereof (e.g. lowest part thereof in case the layer in fact contains several at least initially separate sub-layers, which is possible) may have been provided with features such as surface forms in the shape of e.g. recesses or holes, configured to accommodate at least part of the protrusions the electronics cause on the substrate. The lightguide layer comprising optically transmissive material is configured to transmit light incoupled from the embedded light sources that are located on the substrate film. The light is preferably outcoupled from the lightguide layer through the outer surface thereof, which is the surface on the opposing, other side of the lightguide relative to the side of the substrate film and light sources embedded in the lightguide material.

In various embodiments, the electronics included in the assembly, as provided on the substrate film and/or on further layer(s) or element(s) such as masking layer, may generally comprise at least one feature selected from the group consisting of: conductive trace, printed conductive trace, contact pad, component, integrated circuit (chip), processing unit, memory, communication unit, transceiver, transmitter, receiver, signal processor, microcontroller, battery, light emitting device, light sensing device, photodiode, connector, electrical connector, optical connector, diode, LED, OLED (Organic LED), printed electronic component, sensor, force sensor, antenna, accelerometer, gyroscope, capacitive switch or sensor, electrode, sensor electrode, printed electrode, printed sensor electrode, and photovoltaic cell. Electronics may be printed by means of printed electronics technology (e.g. screen printing or ink jetting, or other additive methods) and/or mounted. The electronics may be at least partially embedded e.g. in the molded lightguide layer or between different layers. Some features such as connectors, which may be arranged to supply power to the assembly, for instance, may be at least partially exposed to the environment of the assembly.

In case there are several layers (e.g. substrate and masking layer) provided with electronics in the multilayer stack, the layers may besides structurally via the molded layer, be also functionally, e.g. electrically, connected together to enable e.g. signalling and/or current provision between them.

The connection between the layers may be realized through the use of conductive elements such as a metal pin, flex circuit, etc. In some embodiments, also wireless connection (e.g. rf or optical) may be applied.

The (wired) connection may be established subsequent to molding or before that using e.g. applicable mold features to protect the connecting element during molding. Alternatively or additionally, e.g. a lead-through may be established for the connecting element during molding by appropriate mold feature such as a column preventing the material from flowing to the space occupied by it.

As one other alternative or supplementary option, the layers may be e.g. electrically connected together at the edges, optionally via electrical wiring, flex circuit or other conductors, which may enable omitting e.g. the removal of molded material for the connection afterwards from a more central area of the established multilayer stack, or arranging a specific mold feature such as a column for creating a necessary lead-through.

As a further option, the molded material may be machined such as drilled or otherwise processed to arrange a lead-through therein for the connection and related conductive element(s).

Power supply and/or communication connection to any layer having regard to external electronics or e.g. host device electronics may be arranged generally in a similar fashion, e.g. via side contacts provided at the edge.

As alluded hereinbefore, the cover layer, masking layer, associated window fill material(s), substrate film, bottom layer and/or other elements of the assembly may have been provided with visually distinguishable, decorative/aesthetic and/or informative, features such as graphical pattern and/or color thereon or therein. The features may have been embedded in the assembly below the exterior surfaces thereof and/or provided on the exterior surface thereof. Accordingly, IML (in-mold labeling)/IMD (in-mold decoration) technique is applicable for manufacturing these features.

In various embodiments, the used mold may incorporate surface shapes that establish corresponding mirror features thereof in the molded plastic lightguide layer. The shapes/features may include e.g. a protrusion, grating, boss; boss-base, recess, groove, ridge, hole, or a cut.

Figure 1:
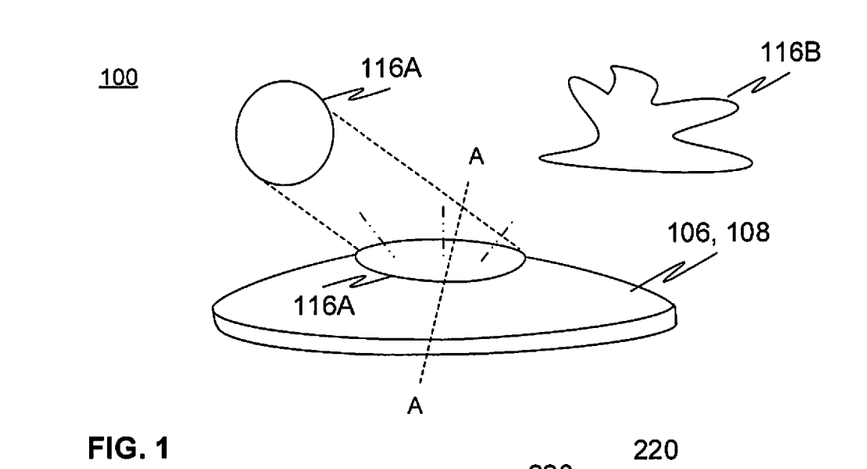
FIG. 1 illustrates one embodiment of a multilayer assembly in accordance with the present invention.

With reference to the attached figures, FIG. 1 illustrates at 100 one embodiment of a multilayer assembly in accordance with the present invention, in particular exterior thereof.

The depicted, merely exemplary, assembly 100 is generally of somewhat flat or planar discus shape with low side walls, if any. The exterior surface of the assembly 100 is at least partially defined by the masking layer 106 or optional cover layer(s) 108 thereon. A substantially transparent or at least translucent, in this example circular, window 116A may be free from material or contain a circular, substantially planar plate of transparent or translucent material, e.g. plastic or glass. In the figure, the window 116A has been depicted also separately as indicated by the guiding broken lines leading to the installation position for illustrative purposes.

A person skilled in the art appreciates the fact the optimum shape may be determined case-specifically based on optical, size and aesthetic objectives. Accordingly, on the right one still merely exemplary more complex option 116B for the window shape is shown.

In other feasible embodiments, the assembly 100 and related elements could bear more three-dimensional shape thus having also considerable thickness or 'height'.

The shown assembly 100 has strong (circular) symmetry around its thickness/height axis but in some other embodiments the assembly or at least one or more of its components bear different symmetry or substantially no symmetry (unsymmetrical) at all.

Figure 2:
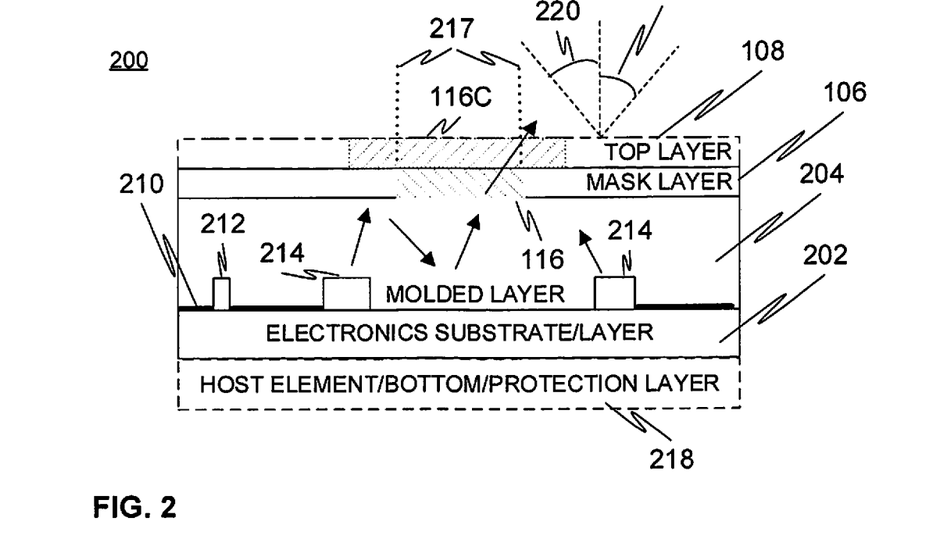
FIG. 2 is a cross-sectional side view of an embodiment of a multilayer structure in accordance with the present invention.
Figure 3:
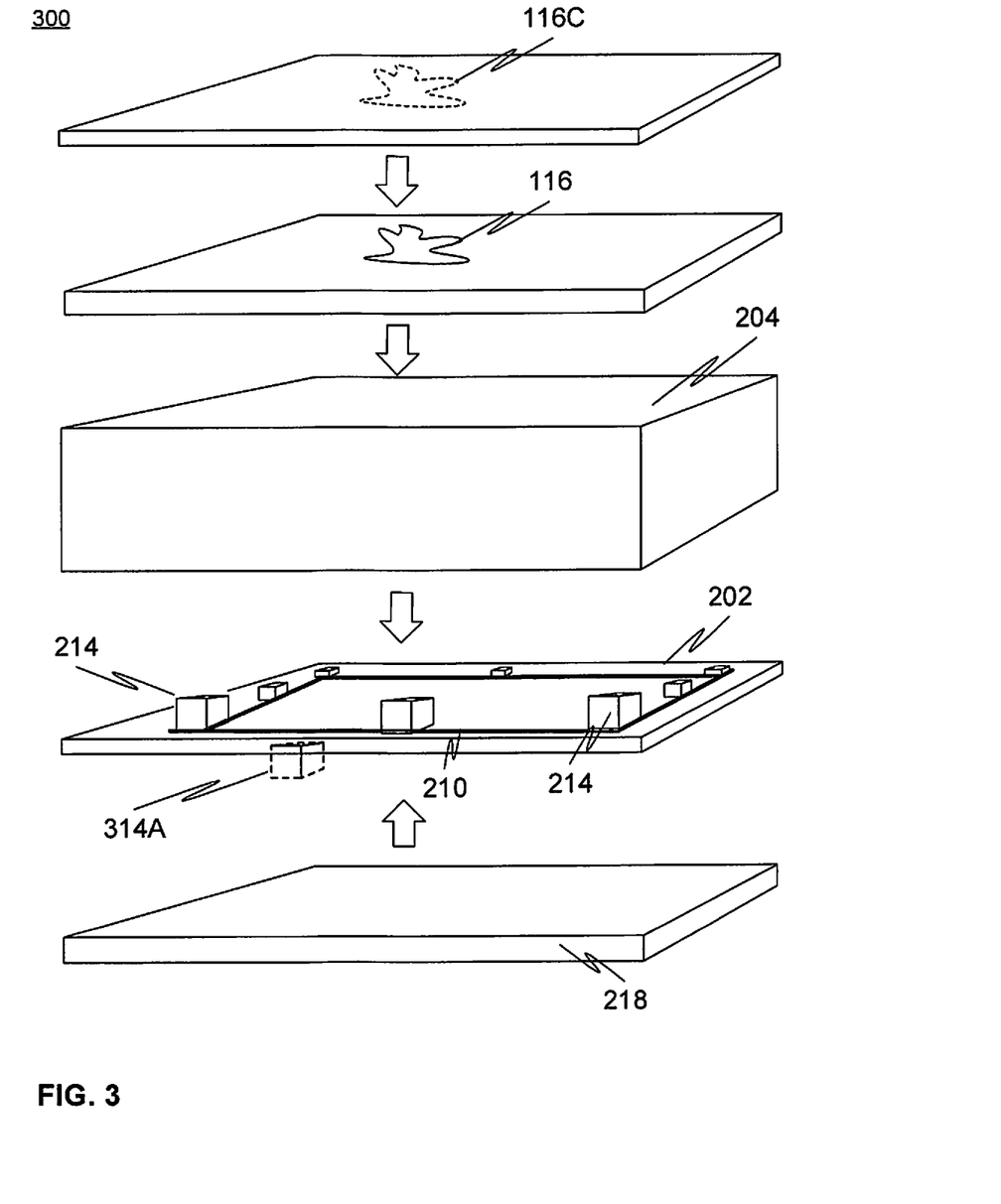
FIG. 3 illustrates conceptually one embodiment of a manufacturing process for acquiring the multilayer assembly of the present invention and related elements of the assembly.

FIG. 2 shows, via a cross-sectional side view, an embodiment 200 of a multilayer assembly according to the present invention. This mainly conceptual representation may thus cover e.g. the embodiment of FIG. 1 and various other embodiments. Having regard to FIG. 1, the view could have been taken along line A-A, for instance. FIG. 3 illustrates, at 300, essentially the same or similar embodiment especially from the standpoint of the manufacturing process and layered construction. In FIG. 3, the illustrated layer thicknesses are only exemplary but may also reflect a real-life scenario in terms of relative thicknesses. For instance, the substrate 202 may be of film type (with e.g. about 0.1 millimetre thickness) while e.g. the lightguide layer 204 may be substantially thicker, e.g. one or few millimetres, or more.

A substrate 202 has been provided with elements such as electrically conductive traces (conductors) 210, electronic components 212, 214 such as light sources 214, light receivers/sensors, integrated circuits, etc. as mentioned hereinbefore at least on first side and related surface thereof (the top/upper side in the figure). Additionally, such elements 314A could be provided on both sides thereof and/or embedded therein, optionally at least partly after molding of a lightguide layer 204 of preferably thermoplastic material.

In some applications, instead of molding the lightguide layer 204 it could be provided otherwise with reference to e.g. a ready-made element preferably containing the necessary surface forms such as recesses for receiving and accommodating at least part of the electronics 212, 214 protruding from the first, upper, surface of the substrate 204.

A masking layer 106 may be laminated to or produced on top of the lightguide layer 204. The masking layer 106 contains at least one window 116, or in some embodiments, a plurality of windows as discussed hereinbefore, for enabling the light emitted by the light sources 214 to be transmitted through towards the environment.

The window 116, lightguide layer 204 and light sources 214 (and/or other relevant elements, such as light detectors/sensors) have been configured in terms of e.g. mutual position, materials, dimensions and shape such that the light emitted by the sources 214, propagating within the lightguide layer 204 and incident on the window(s) 116 passes through the window(s) 116 at least having regard to selected incident angles.

Yet, the configuration is preferably such that the light sources and/or other internal elements, such as additional electronics, remain hidden from the viewer substantially completely or at least within a selected inspection angle 220 relative to a reference such as the surface normal of the assembly (i.e. the surface normal of the window fill/masking layer 106 or of potential top layer 108, or even of lightguide 204 in cases where there's no window fill material). The magnitude of the associated critical angle may be e.g. about 10, 15, 20, 30, 40, 45, 50, 60 or more in degrees. In some other embodiments, the reference relative to which and potentially around which, the above viewing angle is defined could differ from the above surface normal and may therefore be e.g. a line at a certain angle such as 45 deg angle therefrom.

At least one cover/top layer 108 may be optionally provided and arranged with a window 116C that is aligned relative to the window of the masking layer 106 so that the light exits the overall assembly, not just the lightguide 204 and masking layer 106, to desired extent. For example, the windows 116, 116C may be substantially superimposed along the thickness/height direction of the assembly.

The windows 116, 116C may generally be of the same or different shape and optionally dimensions. In the shown scenario the overlapping window 116C is larger than window 116, but they could be of the same size e.g. laterally or generally, which is indicated by broken vertical lines 217. The windows may be planar but also considerable 3d shapes (i.e. with comprehensive thickness dimension) even with thickness variation are possible. For example, different surface topologies may be applied for implementing desired optical or other, e.g. insulation, functionalities and/or related functional elements, e.g. lenses, prisms, diffractive elements, etc. therewith.

At least one bottom layer 218 may be optionally provided below the substrate 202 on the side opposite to the lightguide layer 204. The bottom layer 218 may have aesthetic (provided by e.g. graphics, surface forms, color, etc.), tactile (e.g. through surface forms, material selection), protective (material properties, thickness, flexibility/stiffness, hardness, insulation properties, etc.), connective/fixing (e.g. stickiness, adhesion, mechanical such as protrusion, recess, hook, velcro), conductive (electrically conductive material, traces, leads/wires or other conductors) and/or other function.

In some embodiments, the bottom layer(s) 218 are omitted and the assembly 200 is attached via the substrate 202 to the host device or other host element 218. As a further alternative, the assembly 200 may be of stand-alone element or device type or attach to the host or other element via other surface (e.g. via side wall(s)/edges or top surface).

In some embodiments, the assembly 200 forms at least part of a casing or cover of the host device/element. The assembly may be shaped accordingly to exhibit a generally convex, hollow, receptacle and/or container shape, for example.

The assembly 200 may be configured so as to effectuate internal reflection, preferably total internal reflection based propagation of light within the lightguide layer 204. The reflection type propagation of light instead of unwanted absorption/leaking may be enhanced through using suitable materials. The lightguide layer 204 may have e.g. higher refractive index than the adjacent masking layer 106, substrate 202, bottom layer/host element surface/protection layer 218 and/or associated reflector. Yet, the location and geometry of the lightguide layer 204 relative to the light sources 214, such as top or side emitting LEDs, may be configured such that the light generally arrives at the material interfaces with angles greater than the related critical angle to ensure internal reflections as being understood by a person skilled in the art.

In some embodiments, e.g. the substrate 202 and lightguide layer 204 have substantially similar optical properties in terms of e.g. refractive index. The interface between the two may be then considered transparent or substantially non-existing relative to the incident light and e.g. total internal reflection based propagation thereof within the then functional combination of lightguide layer 204 and substrate 202.

Having regard to the illumination features of the assembly 200, one general objective may be in providing uniform lighting, or uniform 'brightness' distribution, via the window 116 towards the environment without hotspots as mentioned hereinearlier. The directivity of the light (is it e.g. collimated or diffuse) may be determined case-specifically as well. For example, diffuse/collimating lens or other feature could be implemented by the properly shaped window fillings 116, 116C and/or other elements of the assembly. Embedded reflecting/mirroring features such as plates, films, or layer surfaces could be utilized for similar purpose.

In addition to the light projected/emitted by the assembly 200 (originated by the light sources 214) the perceived illumination uniformity of the surface also depends on the uniformity of the reflected external light.

Regarding the reflection properties of the window 116, 116C relative to external light arriving thereat from the environment of the assembly 200, the associated filling (or other element, such as the lightguide layer 204, of the assembly receiving the external light if there's no window filling in the case of e.g. through-hole type window) may incorporate an outer surface facing the environment. That surface is preferably ideally or maximally diffusive to reflect such incident light equally in every direction. This kind of diffusion property may be achieved by elevating surface roughness, for example.

To obtain the desired illumination characteristics such as uniformity, in some embodiments the assembly 200 may be configured in terms of illuminance of the window 116, 116C or the other element defining at least part of the exterior surface outcoupling the internally transmitted light to the environment and potentially reflecting external light. Constant illuminance of the window 116, 116C from the underlying lightguide layer 204 may be thus considered as one potential design objective.

Additionally or alternatively, luminance and/or luminous intensity of the window 116, 116C or the other element may be configured to be at least sufficiently (the appropriate level of sufficiency shall be naturally determined embodiment-specifically by a skilled person) constant.

Generally, the illumination properties of the assembly 200 and particularly e.g. the window 116, 116C thereof may indeed be determined by the combination of the used elements related materials, their mutual positioning, as well as dimensions and shape. The shape may cover both surface topology and overall geometry.

Figure 4:
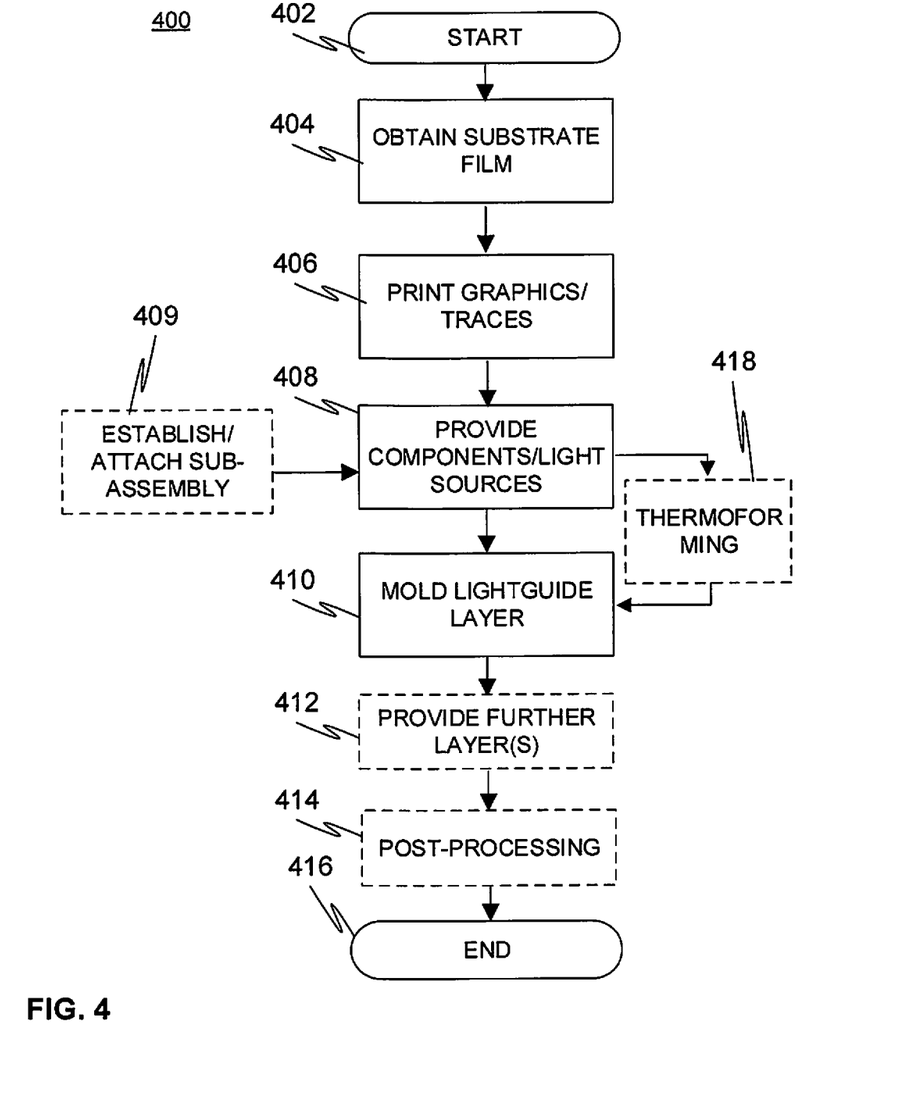
FIG. 4 is a flow diagram disclosing an embodiment of a method in accordance with the present invention.

FIG. 4 includes a flow diagram 400 disclosing an embodiment of a method in accordance with the present invention.

At the beginning of the method for manufacturing the multilayer structure, a start-up phase 402 may be executed. During start-up 402, the necessary tasks such as material, component and tools selection, acquisition, calibration and other configuration activities may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding/IMD (in-mold decoration), lamination, bonding, thermoforming, cutting, drilling and/or printing equipment, among others, may be thus ramped up to operational status at this stage. Mold(s) may be prepared with necessary surface forms, etc.

At 404, a preferably flexible substrate film or potentially other preferably planar substrate element for accommodating electronics is obtained. A ready-made element of substrate material, e.g. a roll of plastic film, may be acquired. In some embodiments the substrate film itself may be first produced in-house by molding, extrusion or other methods from the desired source material(s). Optionally, the substrate film is processed. It may be, for example, coated, cut and/or provided with openings, notches, recesses, cuts, etc. as contemplated hereinbefore. The initial and/or resulting film may bear e.g. rectangular, square or circular shape. The substrate may be opaque, translucent or substantially transparent having regard to selected wavelengths of light or generally electromagnetic radiation, such as the operation wavelengths of the light sources or detectors to be provided thereon.

At 406, a number of conductive traces defining e.g. conductor lines of a desired circuit pattern or circuit design, contact pads (or other contact areas), etc. for electrically coupling electronic components, are provided on the substrate film, preferably by one or more techniques of printed electronics with reference to related additive technologies. For example, screen, inkjet, flexographic, gravure or offset lithographic printing may be utilized. Also further actions cultivating the film involving e.g. printing of graphics, visual indicators, etc. may take place here.

At 408, a number of light sources such as LEDs are provided on the substrate (surface) optionally with one or more other electronic components. In practice, e.g. ready-made components such as various SMDs may be attached to the selected contact areas by solder and/or adhesives. Alternatively or additionally, printed electronics technology may be applied to actually manufacture at least part of the components, such as OLEDs, directly onto the film(s).

In some embodiments, the substrate film may be formed to exhibit a desired 3d-shape (a substantially non-planar shape), preferably through thermoforming 418 such as vacuum or pressure forming. The substrate containing thermoformable material may be shaped to better fit the host device or use scenario. Additionally or alternatively, thermoforming could even take place after molding 410 in case the already-established multilayer stack is designed to survive such processing. Having regard to forming techniques, e.g. pressure forming may be applied to provide the substrate with very precise, sharp details. Pressure forming may be generally preferred when the substrate lacks (through-) holes that could enable undesired flow and resulting pressure drop via them.

In some embodiments, a number of sub-assemblies of electronics/sub-substrates may be provided as such to the primary substrate at 409 and secured by adhesive, for instance.

At 410, at least one thermoplastic layer establishing a lightguide for the light emitted by the light sources is molded upon the first side of the substrate film and at least part of the electronics thereon, such as traces and a number of electronic components. Preferably the light sources are at least partially embedded within the molded material. Accordingly, the optical contact between them and the molded lightguide layer will be excellent with low optical coupling losses. In practice, the substrate film may be used as an insert in an injection molding process. The first side and associated surface of the substrate element may be, in some embodiments, left with one or more areas, such as borders, free from the molded plastics. In some embodiments, both sides of the substrate film may be provided with molded layer(s). The thermoplastic material used is preferably at least translucent. It may still exhibit at least one color.

In case two films are used, one designated as the substrate and the other as e.g. the masking layer or a layer to be located below it in the assembly stack, both of them may be inserted in their own mold halves so that the plastic layer is injected between them. The other film may have been optionally provided with electronics (e.g. printed electronics, such as traces or components, sensor electrodes and/or mounted components) prior to molding i.e. during the execution of items 406, 408 and/or formed prior to molding. The electronics and/or other elements may be provided e.g. on the side of the other film facing the substrate film and molded plastics.

The plastic may be injected via one or more locations e.g. from the side(s) of the film(s). Thus e.g. edge injection and/or hole injection (plastic injection between the films through one or more holes in the film(s)) may be applied. Alternatively, the other film for establishing e.g. the masking layer could be attached to an aggregate of the substrate film and plastic lightguide layer afterwards by suitable lamination technique.

The other film could be provided with at least one hole for the afore-discussed window(s). The hole may result from cutting, drilling, carving, stamping or etching operation, for instance. During molding, the thermoplastic molding material may then enter the hole from either or both sides, optionally also proceeding to the other side of the film, and establish at least part of the window fill for at least the concerned film.

In some embodiments, there is no through-hole ready in the other film prior to the molding. The film may still optionally have e.g. a thinned or otherwise weakened (formed using e.g. one of the abovementioned operations) spot at the target location of the window to facilitate window formation during molding due to the pressure of the molded material. In some embodiments, the mold surface contacting the other film may have a surface feature such as a recess, perforated area, flap or pinhole thereon corresponding to the target location of the window in the other film, which may facilitate forming and/or filling the window during molding. The feature thus matching and facing the desired area of the window in the other film may further enable the molded material to flow via the window to the other side (i.e. mold/exterior side) of the other film.

Having regard to few examples of the applicable material selections, the substrate film and/or potential further film(s) or material layers may substantially consist of or comprise at least one material selected from the group consisting of: polymer, thermoplastic material, PMMA (Polymethyl methacrylate), Poly Carbonate (PC), polyimide, a copolymer of Methyl Methacrylate and Styrene (MS resin), glass, organic material, fibrous material, Polyethylene Terephthalate (PET), and metal.

The feasible molding methods include e.g. injection molding. In case of several plastic materials, they may be molded using a two-shot or generally multi-shot molding method. A molding machine with multiple molding units may be utilized. Alternatively, multiple machines or a single re-configurable machine could be used for sequentially providing several materials.

The first side and thus the associated first surface of the substrate has thus been at least partially, having regard to the related surface area, overmolded by plastic, preferably and typically thermoplastic, material. Optionally, several overmolding-applicable materials may be utilized to establish one or more molded layers, e.g. adjacent layers lying side-to-side on the first side of the substrate and/or forming a stack of multiple superposed layers thereon.

The (thermo)plastic material used to establish the molded layer(s) comprises optically substantially opaque, transparent or translucent material having regard to selected wavelengths enabling e.g. light emitted by the embedded light sources, such as visible light, to pass through it with negligible loss. The sufficient transmittance of the material at selected wavelengths may be about 60%, 70%, 75%, 85%, 90% or 95% or higher, for example, depending on the embodiment. Possible further molded (thermo)plastic material such as material establishing the masking layer may be substantially opaque or translucent.

The plastic layer(s) provided by the overmolding procedure may generally incorporate e.g. elastomeric resin. In more detail, the layer(s) may include one or more thermoplastic materials that include at least one material selected from the group consisting of: PC, PMMA, ABS (Acrylonitrile butadiene styrene), PET, nylon (PA, polyamide), polypropylene (PP), polystyrene (GPPS), and MS resin.

At 412, further layer(s) such as the masking layer if not already present with reference to the previous paragraphs, may be finally provided to the assembly. Provision may include direct manufacturing through e.g. molding, deposition/other coating method, and attaching. A window-defining cut or hole may be provided in the masking and potential further layers by drilling, carving, sawing, etching, cutting (e.g. with laser or mechanical blade), or using any other feasible processing method as being understood by a person skilled in the art. Alternatively, the layer(s) may be produced with ready-made window feature through molding, for example.

Suitable lamination techniques for fixing various layer(s) to the assembly utilize e.g. adhesive, elevated temperature and/or pressure based bonding.

Regarding the resulting overall thickness of the obtained stacked structure, it heavily depends on the used materials and related minimum material thicknesses providing the necessary strength in view of the manufacturing and subsequent use. These aspects have to be considered on case-by-case basis. For example, the overall thickness of the structure could be about 1 mm, but considerably thicker or thinner embodiments are also feasible.

Item 414 refers to possible post-processing tasks and attachment to a host device or element.

At 416, method execution is ended.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario. For example, in some applications instead of substantially opaque masking layer, translucent (e.g. diffusive) material could be used therein. The translucent material would still hinder or prevent direct light propagation through the masking layer.

The invention claimed is:

1. A multilayer assembly for an electronic device comprises:
    a flexible substrate film configured to accommodate electronics on at least a first side thereof, the substrate film having the first side and a second side, the substrate film including at least one material selected from the group consisting of: thermoplastic material, PMMA (Polymethyl methacrylate), Poly Carbonate (PC), polyimide, a copolymer of Methyl Methacrylate and Styrene (MS resin), glass, organic material, fibrous material, Polyethylene Terephthalate (PET), and metal, the substrate film including a three-dimensional, non-planar shape such that the substrate film has different thicknesses along a length thereof;
    conductive traces printed by means of printed electronics technology on the first side of the substrate film,
    light sources provided on the first side of the substrate film and configured to emit light of predetermined frequency or frequency band, including or substantially limiting to visible light,
    a molded plastic lightguide layer provided onto the first side of the substrate film and at least partially embedding the light sources, the plastic lightguide layer being of optically at least one of translucent, at least one substantially transparent, material having regard to the predetermined frequency or band, wherein the plastic lightguide layer is configured to transmit light emitted by the embedded light sources so that the transmitted light propagates within the lightguide layer and is outcoupled from the plastic lightguide layer via an outer surface thereof substantially opposite to the embedded light sources, and
    a masking layer provided on the outer surface of the plastic lightguide layer, containing substantially opaque material to block external view of at least some internals of the multilayer assembly including the light sources, wherein the masking layer defines a window for letting the light emitted by the embedded light sources and propagated within the plastic lightguide layer to pass through the masking layer towards the environment,
    the light sources, masking layer and related window being mutually configured such that there is substantially no direct line-of-sight (LOS) path at least within a selected viewing angle from outside the assembly, including zero angle from the surface normal of the masking layer, to the light sources and optionally further electronics through the window.

2. The assembly of claim 1, further comprising a protective cover layer on the masking layer.

3. The assembly of claim 2, wherein the cover layer is of substantially optically transparent material having regard to the frequency or frequency band of the light sources, or defines a window of no material, such as a through-hole, or of substantially optically translucent or transparent material having regard to the frequency or band of the light sources.

4. The assembly of claim 1, further comprising a bottom layer on the second side of the substrate film.

5. The assembly of claim 4, wherein the bottom layer comprises or is established by an attaching feature, including adhesive or a mechanical fixing structure, for securing the assembly to a host device or host element.

6. The assembly of claim 1, wherein the window is a through-hole.

7. The assembly of claim 1, wherein the window comprises substantially translucent or transparent material having regard to said frequency or band.

8. The assembly of claim 1, wherein the window defines an optical diffuser.

9. The assembly of claim 1, wherein the window defines at least one illuminated element selected from the group consisting of: graphical pattern, text, symbol, number, and figure.

10. The assembly of claim 1, wherein the illuminance, luminance or luminous intensity associated with the window is substantially constant to provide uniform illumination to the environment.

11. The assembly of claim 1, wherein the substrate film contains optically substantially translucent or transparent material having regard to said frequency or band.

12. The assembly of claim 1, configured for at least one of substantially internal reflection—or at least one of substantially total internal reflection, based propagation of light therewithin between the light sources and the window.

13. The assembly of claim 1, wherein the plastic lightguide layer includes at least one material selected from the group consisting of: PC, PMMA, ABS, PET, nylon (PA, polyamide), polypropylene (PP), polystyrene (GPPS), and MS resin.

14. The assembly of claim 1, wherein the electronics located on the substrate comprise at least one element selected from the group consisting of: conductive trace, printed conductive trace, contact pad, component, integrated circuit (chip), processing unit, memory, communication unit, transceiver, transmitter, receiver, signal processor, microcontroller, battery, light emitting device, light sensing device, photodiode, connector, electrical connector, optical connector, diode, OLED (Organic LED), printed electronic component, sensor, force sensor, antenna, accelerometer, gyroscope, capacitive switch or sensor, electrode, sensor electrode, printed sensor electrode, and photovoltaic cell.

15. A method of establishing a multilayer assembly for an electronic device comprising:
    obtaining a preferably flexible substrate film configured to accommodate electronics on at least a first side thereof, said film having the first side and a second side;

printing by means of printed electronics technology, a number of conductive traces on the first side of the substrate film;

providing a number of light sources on the first side of the substrate film, said light sources being configured to emit light of predetermined frequency or frequency band;

molding a plastic lightguide layer onto the first side of the substrate and thereby at least partially embedding the light sources, the plastic lightguide layer being of optically at least translucent material having regard to the predetermined frequency or band of light, whereupon the plastic lightguide layer is configured to transmit light emitted by the embedded light sources so that the transmitted light propagates within the lightguide layer and is outcoupled from the lightguide layer via an outer surface thereof substantially opposite to the embedded light sources;

providing a masking layer on the outer surface of the lightguide layer containing substantially opaque material to block external view of at least some internals of the multilayer structure including the light sources, wherein the masking layer defines a window for letting the light emitted by the embedded light sources and propagated within the lightguide layer to pass through the masking layer towards the environment, the light sources, masking layer and related window being mutually configured such that there is substantially no direct line-of-sight path at least within a selected viewing angle from outside the assembly to the light sources and optionally further electronics through the window; and providing a further film for establishing either the masking layer or a layer between the masking layer and lightguide layer, and the substrate film within a mold, each against opposing mold halves, and molding thermoplastic material for forming the plastic lightguide layer between the two films.

16. The method of claim 15, wherein the further film contains or is processed to contain a through-hole for the window.

17. The method of claim 15, wherein the further film contains or is processed to contain a surface feature, at least one selected from the group of a thinned portion, pinhole, perforated portion or a flap, substantially at a target location of the window to enable window formation during the molding procedure due to the associated pressure introduced to the feature.

18. The method of claim 15, wherein the mold contains a recess or hole aligned so as to substantially match the location of the window.

* * * * *